US010916425B2

(12) United States Patent
Ogawa et al.

(10) Patent No.: US 10,916,425 B2
(45) Date of Patent: Feb. 9, 2021

(54) METHOD FOR MANUFACTURING SILICON SINGLE CRYSTAL, FLOW STRAIGHTENING MEMBER, AND SINGLE CRYSTAL PULLING DEVICE

(71) Applicant: SUMCO CORPORATION, Tokyo (JP)

(72) Inventors: Fukuo Ogawa, Tokyo (JP); Yasuhito Narushima, Tokyo (JP); Koichi Maegawa, Tokyo (JP); Yasufumi Kawakami, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/484,619

(22) PCT Filed: Nov. 14, 2017

(86) PCT No.: PCT/JP2017/040890
§ 371 (c)(1),
(2) Date: Aug. 8, 2019

(87) PCT Pub. No.: WO2018/154874
PCT Pub. Date: Aug. 30, 2018

(65) Prior Publication Data
US 2020/0027732 A1 Jan. 23, 2020

(30) Foreign Application Priority Data

Feb. 24, 2017 (JP) ................. 2017-034116

(51) Int. Cl.
*H01L 21/02* (2006.01)
*C30B 29/06* (2006.01)

(52) U.S. Cl.
CPC ........ *H01L 21/02636* (2013.01); *C30B 29/06* (2013.01); *H01L 21/02381* (2013.01); *H01L 21/02513* (2013.01); *H01L 21/02598* (2013.01)

(58) Field of Classification Search
CPC ................. C30B 27/02; C30B 29/06
See application file for complete search history.

(56) References Cited

U.S. PATENT DOCUMENTS

2009/0229512 A1 9/2009 Kamogawa et al.

FOREIGN PATENT DOCUMENTS

CN 105358743 A 2/2016
JP S61-227986 A 10/1986
(Continued)

OTHER PUBLICATIONS

International Search Report issued in International Patent Application No. PCT/JP2017/040890, dated Feb. 6, 2018.
(Continued)

*Primary Examiner* — John P. Dulka
(74) *Attorney, Agent, or Firm* — Greenblum & Bernstein, P.L.C.

(57) ABSTRACT

A manufacturing method of monocrystalline silicon includes: disposing a flow regulator including a body in a form of an annular plate, provided under a heat shield, surrounding monocrystalline silicon; controlling an internal pressure of a chamber to 20 kPa or more during growth of monocrystalline silicon; keeping the flow regulator spaced from a dopant-added melt; and introducing inert gas into between the monocrystalline silicon and the heat shield to divide the inert gas into a first flow gas and a second flow gas.

8 Claims, 7 Drawing Sheets

(56) References Cited

FOREIGN PATENT DOCUMENTS

| JP | 3-7637 | | 2/1991 |
|----|--------|---|--------|
| JP | 5-238883 | | 9/1993 |
| JP | 2000-281479 | | 10/2000 |
| JP | 2007-91493 | | 4/2007 |
| JP | 2007-204305 A | | 8/2007 |
| JP | 2010-18446 | | 1/2010 |
| JP | 2010018446 A | * | 1/2010 |
| JP | 2010-37114 | | 2/2010 |
| JP | 2010037114 A | * | 2/2010 |

OTHER PUBLICATIONS

International Preliminary Report on Patentability (IPRP) for International Patent Application No. PCT/JP2017/040890, dated Aug. 27, 2019.

* cited by examiner

METHOD FOR MANUFACTURING SILICON SINGLE CRYSTAL, FLOW STRAIGHTENING MEMBER, AND SINGLE CRYSTAL PULLING DEVICE

TECHNICAL FIELD

The present invention relates to a manufacturing method of monocrystalline silicon, a flow regulator, and a monocrystal pull-up apparatus.

BACKGROUND ART

A method of manufacturing monocrystalline silicon according to Czochralski method has been typically known (see, for instance, Patent Literature 1).

A monocrystal pull-up apparatus of Patent Literature 1 includes: a tubular body coaxially surrounding monocrystalline silicon; and a gas flow regulator provided to a lower end of the tubular body and having a truncated cone-shaped surface extending downward. An opening is provided near a connector of the tubular body and the gas flow regulator. An inner diameter of the gas flow regulator is smaller than an inner diameter of the tubular body.

When monocrystalline silicon is manufactured by using a dopant in a form of antimony (Sb), under a reduced pressure of 100 mbar (about 10 kPa), most of downward inert gas flows along the truncated cone-shaped surface of the gas flow regulator from the opening to decrease the inert gas arriving at or near a crystallized part of a surface of a melt through an inside of the tubular body, thereby reducing evaporation of SiO and $Sb_2O_3$ and increasing an oxygen concentration in silicon crystal.

CITATION LIST

Patent Literature(s)

Patent Literature 1: JP 5-238883 A

SUMMARY OF THE INVENTION

Problem(s) to be Solved by the Invention

However, reduction in evaporation of the dopant is not sufficient according to the method of Patent Literature 1.

An object of the invention is to provide a manufacturing method of monocrystalline silicon, a dopant flow regulator and a monocrystal pull-up apparatus, which are capable of reducing evaporation of a dopant.

Means for Solving the Problem(s)

An aspect of the invention provides a manufacturing method of monocrystalline silicon using a monocrystal pull-up apparatus including: a crucible; a crucible driver configured to raise, lower and rotate the crucible; a heater configured to heat the crucible to generate a dopant-added melt in which a dopant is added to a silicon melt; a pull-up portion configured to bring a seed crystal into contact with the dopant-added melt and subsequently pull up the seed crystal to grow monocrystalline silicon; a cylindrical heat shield provided above the crucible, surrounding the monocrystalline silicon; a chamber housing the crucible, the heater and the heat shield; and an intake provided on an upper side of the chamber and configured to introduce inert gas into the chamber, in which the manufacturing method includes; disposing a flow regulator under the heat shield, the flow regulator including an annular plate body surrounding the monocrystalline silicon; during growth of the monocrystalline silicon, simultaneously, controlling an internal pressure of the chamber to 20 kPa or more; keeping the flow regulator spaced from the dopant-added melt; and introducing the inert gas from above to between the monocrystalline silicon and the heat shield to divide the inert gas into a first flow gas flowing along a first flow path between the heat shield and the flow regulator to be away from the monocrystalline silicon and a second flow gas flowing along a second flow path between the flow regulator and a surface of the dopant-added melt to be away from the monocrystalline silicon.

According to the above arrangement, a partial pressure of the dopant being volatilized in the chamber is decreased by controlling the internal pressure of the chamber to 20 kPa or more that is higher than a typical pressure, so that the evaporation of the dopant from the surface of the dopant-added melt (hereinafter, also referred to as a dopant-added melt surface) can be reduced. Moreover, since the flow rate of the second flow gas is reduced by the flow regulator dividing the inert gas into the first flow gas flowing between the heat shield and the flow regulator and the second flow gas flowing between the flow regulator and the dopant-added melt surface, the evaporation of the dopant from the dopant-added melt surface can be reduced.

In the above aspect of the invention, it is preferable that the body of the flow regulator has an inner diameter smaller than an inner diameter at a lower end of the heat shield to form a gas receiver on the body, the gas receiver being located inside with respect to the lower end of the heat shield, and the inert gas is divided into the first flow gas flowing along an upper surface of the gas receiver to be introduced to the first flow path and the second flow gas flowing close to the monocrystalline silicon with respect to the gas receiver to be introduced to the second flow path.

According to the above arrangement, the flow rate of the first flow gas can be increased by forming the gas receiver located inside with respect to the lower end of the heat shield in the body. Consequently, since the flow rate of the second flow gas is decreased, the evaporation of the dopant from the dopant-added melt surface can be further reduced.

In the above aspect of the invention, it is preferable that the monocrystalline silicon grows while a height of the first flow path is kept higher than a height of the second flow path.

According to the above arrangement, the flow rate of the first flow gas can be increased by keeping the height of the first flow path higher than the height of the second flow path. Consequently, since the flow rate of the second flow gas is decreased, the evaporation of the dopant from the dopant-added melt surface can be further reduced.

In the above aspect of the invention, it is preferable that the flow regulator including an extension extending a diagonally-upward-and-outward direction from an outer edge of the body is provided to introduce the first flow gas in the diagonally-upward-and-outward direction.

According to the above arrangement, the first flow gas can be spaced by the extension from a vicinity of the dopant-added melt surface, so that the inert gas flowing over the dopant-added melt surface can be reduced. Consequently, the evaporation of the dopant from the dopant-added melt surface can be further reduced. Moreover, since an outer side of the entire flow regulator is bent upward, even when the amount of the dopant-added melt is reduced due to progress in the growth of the monocrystalline silicon, the pull-up operation of the monocrystalline silicon can be continued while the extension provided on the outer side of the flow regulator is kept in no contact with an inner surface of the crucible whose bottom side is shaped to have a diameter decreasing toward the bottom (e.g., a round bottom).

In the above aspect of the invention, it is preferable that the flow regulator is disposed with an upper end of the extension being positioned above the lower end of the heat shield to prevent, with the extension, radiant heat from at least one of the dopant-added melt, the crucible or the heater from reaching the monocrystalline silicon through the first flow path.

According to the above arrangement, by disposing the flow regulator with an upper end of the extension being positioned above the lower end of the heat shield, radiant heat from at least one of the dopant-added melt, the crucible or the heater can be prevented from reaching the monocrystalline silicon through the first flow path between the lower end of the heat shield and the body of the flow regulator. Consequently, the temperature gradient in the pull-up direction of the monocrystalline silicon can be increased.

In the above aspect of the invention, it is preferable that the flow regulator including a heat insulation material therein is disposed to prevent, with the heat insulation material, radiant heat from at least one of the dopant-added melt, the crucible or the heater from reaching the monocrystalline silicon.

According to the above arrangement, since the heat insulation material is provided inside the flow regulator, the radiant heat from at least one of the dopant-added melt, the crucible and the heater can be effectively prevented from reaching the monocrystalline silicon.

Another aspect of the invention provides a flow regulator attached to a monocrystal pull-up apparatus, the monocrystal pull-up apparatus including: a crucible; a crucible driver configured to raise, lower and rotate the crucible; a heater configured to heat the crucible to generate a dopant-added melt in which a dopant is added to a silicon melt; a pull-up portion configured to bring a seed crystal into contact with the dopant-added melt and subsequently pull up the seed crystal to grow monocrystalline silicon; a cylindrical heat shield provided above the crucible, surrounding the monocrystalline silicon; a chamber housing the crucible, the heater and the heat shield; and an intake provided on an upper side of the chamber and configured to introduce inert gas into the chamber, in which the flow regulator includes: a body in a form of an annular plate, provided under the heat shield and surrounding the monocrystalline silicon, the body forming a first flow path between the body and the heat shield and forming a second flow path between the body and a surface of the dopant-added melt; and an extension extending diagonally upward and outward from an outer edge of the body.

In the above aspect of the invention, it is preferable that at least one of the body or the extension includes a heat insulation material therein.

Still another aspect of the invention provides a monocrystal pull-up apparatus including: a crucible; a crucible driver configured to raise, lower and rotate the crucible; a heater configured to heat the crucible to generate a dopant-added melt in which a dopant is added to a silicon melt; a pull-up portion configured to bring a seed crystal into contact with the dopant-added melt and subsequently pull up the seed crystal to grow monocrystalline silicon; a cylindrical heat shield provided above the crucible, surrounding the monocrystalline silicon; a chamber housing the crucible, the heater and the heat shield; an intake provided on an upper side of the chamber and configured to introduce inert gas into the chamber; and the flow regulator according to the above aspect of the invention provided under the heat shield.

DESCRIPTION OF EMBODIMENT(S)

Exemplary Embodiment(s)

A manufacturing method of monocrystalline silicon SM according to CZ method as an exemplary embodiment of the invention will be described below with reference to FIGS. 1 to 3.

Firstly, a structure of a monocrystal pull-up apparatus 1 used in the manufacturing method of the monocrystalline silicon SM will be described.

Figure 1:
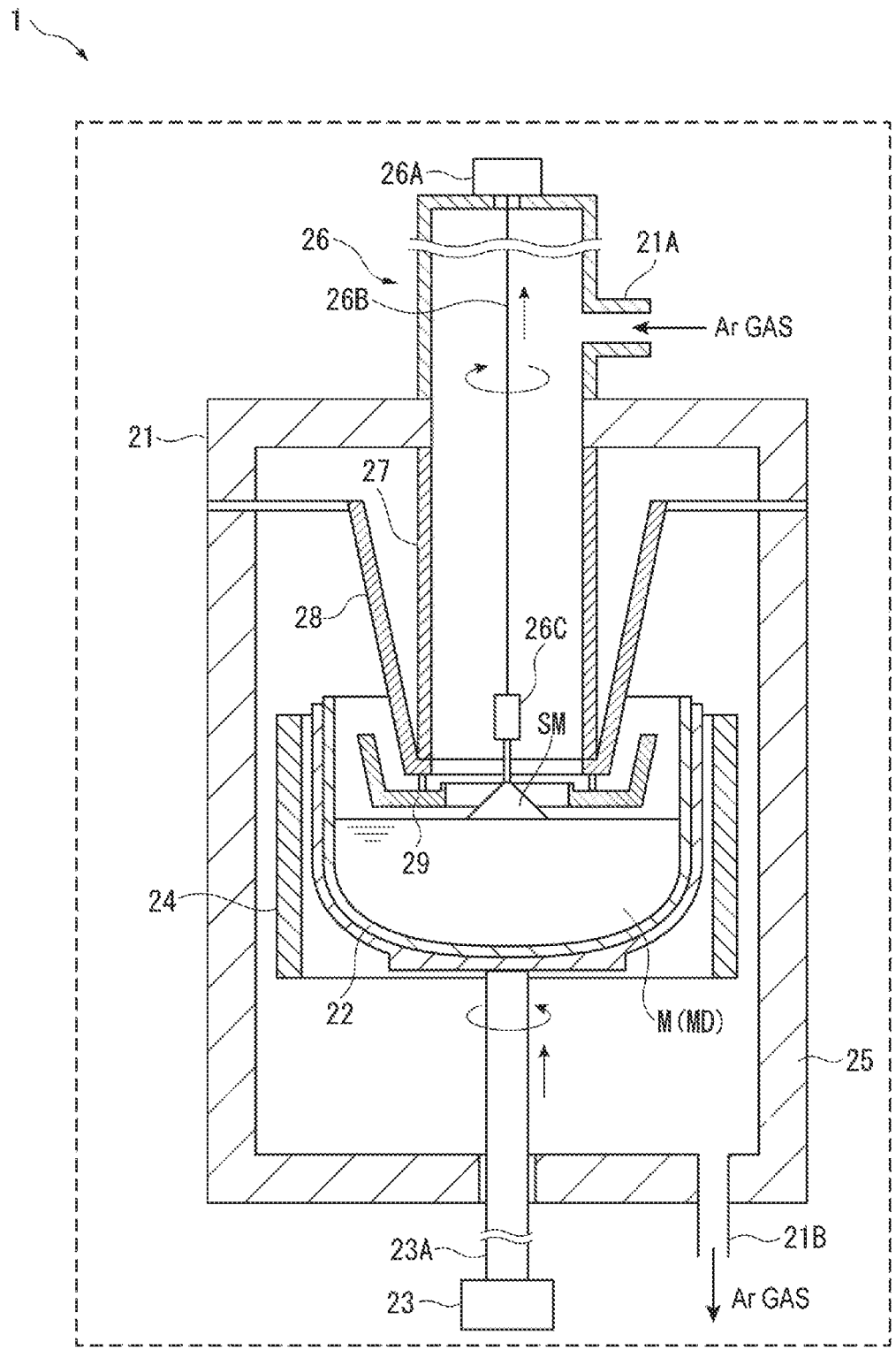
FIG. 1 is a cross-sectional view showing a monocrystal pull-up apparatus according to an exemplary embodiment of the invention.

As shown in FIG. 1, the monocrystal pull-up apparatus 1 includes a chamber 21, a crucible 22 disposed inside the chamber 21, a crucible driver 23, a heater 24, a heat insulation cylinder 25, a pull-up portion 26, a flow regulation cylinder 27, a heat shield 28, and a flow regulator 29.

An intake 21A, from which inert gas (e.g., Ar gas) is introduced into the chamber 21, is provided on an upper side of the chamber 21. An exhaust outlet 21B, through which gas inside the chamber 21 is discharged outward when a vacuum pump (not shown) is driven, is provided on a lower side of the chamber 21.

A predetermined amount of inert gas is introduced from the intake 21A into the chamber 21. Then, the introduced inert gas is discharged from the exhaust outlet 21B on the lower side of the chamber 21, whereby the inert gas flows from the upper side to the lower side in the chamber 21.

The crucible 22 is configured to melt polycrystalline silicon, which is a raw material of the monocrystalline silicon SM, into a silicon melt M.

The crucible driver 23 rotates the crucible 22 at a predetermined speed around a support shaft 23A connected to a lower end of the crucible 22 while raising and lowering the crucible 22 at a predetermined speed.

The heater 24, which is disposed outside the crucible 22, is configured to heat the crucible 22 to generate a dopant-added melt MD in which a dopant is added to the silicon melt M.

The heat insulation cylinder 25 is disposed to surround the crucible 22 and the heater 24.

The pull-up portion 26 includes: a pull-up driver 26A; and a pull-up cable 26B having a first end connected to the pull-up driver 26A. The pull-up driver 26A is configured to vertically move and rotate the pull-up cable 26B at a predetermined speed. A seed holder 26C holding a seed crystal or a doping device (not shown) is attached to a second end of the pull-up cable 26B. The doping device is configured to dope the silicon melt M with a dopant in the crucible 22 to generate the dopant-added melt MD.

The flow regulation cylinder 27, which is in a form of a cylinder surrounding the monocrystalline silicon SM, is configured to guide downward the inert gas flowing from the upper side.

The heat shield 28, which is provided above the crucible 22, is formed in a truncated cone surrounding a lower side of the flow regulation cylinder 27 and the monocrystalline silicon SM. A lower end of the heat shield 28 is connected to a lower end of the flow regulation cylinder 27. The heat shield 28 blocks radiant heat that the heater 24 radiates upward.

The flow regulator 29 includes: an annular plate body 29A; an extension 29B extending diagonally upward and outward from an outer edge of the body 29A; and a projection 29C projecting upward from an inner edge of the body 29A. An inner diameter D2 of the body 29A is smaller than an inner diameter D1 at a lower end of the heat shield 28. A heat insulation material 29D is placed inside the body 29A and the extension 29B.

The flow regulator 29 is spaced below from the heat shield 28 through a support 30 and surrounds the monocrystalline silicon SM. The support 30 in a form of a stick connects the heat shield 28 to the flow regulator 29 at two to four positions substantially equidistant in a circumferential direction of the monocrystalline silicon SM. The flow regulator 29 and the heat shield 28 are coaxially disposed, thereby forming an annular gas receiver 29E at an inner side with respect to the lower end of the heat shield 28. Herein, the gas receiver 29E is a part of an inner region of the body 29A, specifically a region defined from an inner circumferential surface of the body 29A to an intersection of an extension line of an inner surface of the flow regulation cylinder 27 shown by a dotted line in FIG. 2 and an upper surface of the body 29A. Moreover, the upper surface of the body 29A and an upper surface of the extension 29B of the flow regulator 29 are respectively provided in parallel to a bottom surface 28A and an outer circumferential surface 28B of the heat shield 28, thereby forming a first flow path R1 between the flow regulator 29 and the heat shield 28. Moreover, a second flow path R2 is formed between the flow regulator 29 and a surface of the dopant-added melt MD. Further, the flow regulator 29 is provided such that an upper end of the extension 29B is located higher than the bottom surface 28A of the heat shield 28.

Next, a manufacturing method of the monocrystalline silicon SM will be described.

In the exemplary embodiment, the monocrystalline silicon SM including a straight body having a diameter set at 200 mm is manufactured. However, the monocrystalline silicon SM may be manufactured such that the diameter of the straight body is set at 150 mm, 300 mm, 450 mm or the like.

An electrical resistivity of the monocrystalline silicon SM is preferably in a range from 1.2 mΩ·cm to 5.0 mΩ·cm when the dopant is arsenic. The electrical resistivity is preferably in a range from 0.5 mΩ·cm to 2.0 mΩ·cm when the dopant is red phosphorus. The electrical resistivity is preferably in a range from 10 mΩ·cm to 30 mΩ·cm when the dopant is antimony.

Firstly, properties required in the monocrystalline silicon SM are set in the monocrystal pull-up apparatus 1. The required properties are exemplified by the electrical resistivity, a flow rate of inert gas (which is a pull-up condition for satisfying an oxygen concentration), an internal pressure of the chamber 21, a rotation speed of each of the crucible 22 and the monocrystalline silicon SM, and heating conditions of the heater 24.

Next, the heater 24 is controlled on a basis of the set value to heat the crucible 22, thereby melting polycrystalline silicon (silicon material) and the dopant in the crucible 22 to generate the dopant-added melt MD. Subsequently, inert gas is introduced at a predetermined flow rate from the intake 21A into the chamber 21 and the internal pressure of the chamber 21 is maintained at 20 kPa or more. The internal pressure of the chamber 21 is preferably 80 kPa or less.

Next, the pull-up cable 26B is lowered to immerse the seed crystal into the dopant-added melt MD. While the crucible 22 and the pull-up cable 26B are rotated in a predetermined direction, the monocrystalline silicon SM is pulled up to grow.

Figure 2:
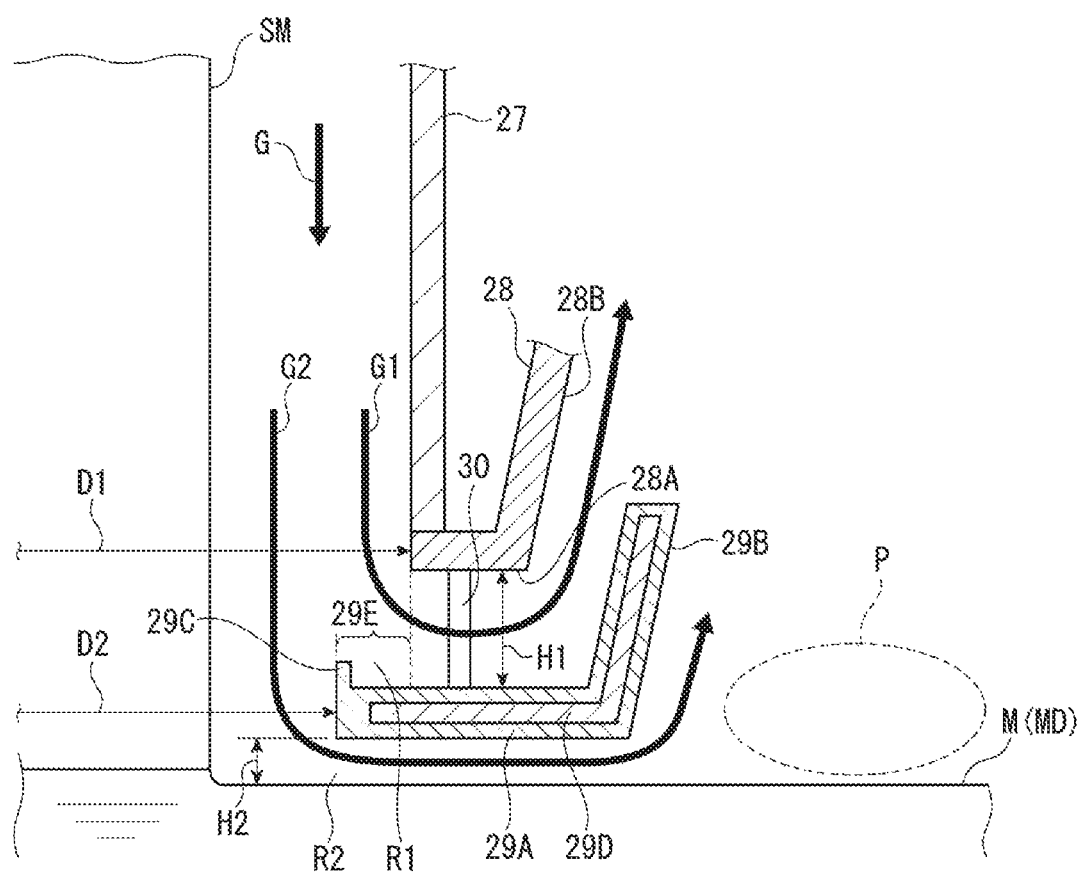
FIG. 2 is an enlarged cross-sectional view showing a flow regulator of the monocrystal pull-up apparatus.

During the growth of the monocrystalline silicon SM, as shown in FIG. 2, an inert gas G flowing downward is divided by the flow regulator 29 into a first flow gas G1 and a second flow gas G2.

At this time, since the inert gas G is introduced into the first flow path R1 by the gas receiver 29E to increase a flow rate of the first flow gas G1, a flow rate of the second flow gas G2 can be decreased. Evaporation of the dopant can be thus reduced by controlling the internal pressure of the chamber 21 to 20 kPa or more, which is higher than a typical pressure, to decrease a partial pressure of the dopant and by decreasing the flow rate of the second flow gas G2.

The speed of raising the crucible 22 is controlled in accordance with a lowering speed of a liquid surface of the dopant-added melt MD such that a height H1 of the first flow path R1 is kept higher than a height H2 of the second flow path R2. With this arrangement, the flow rate of the first flow gas G1 can be increased and the flow rate of the second flow gas G2 can be decreased.

The first flow gas G1 is further introduced diagonally upward and outward by the extension 29B, and is unlikely to flow into a region P near the surface of the dopant-added melt MD-surface, the region P being encircled by a dotted line in FIG. 2. With this arrangement, evaporation of the dopant can be reduced. As described above, the monocrystalline silicon SM having a desired electrical resistivity can be manufactured by reducing the evaporation of the dopant.

Figure 3:
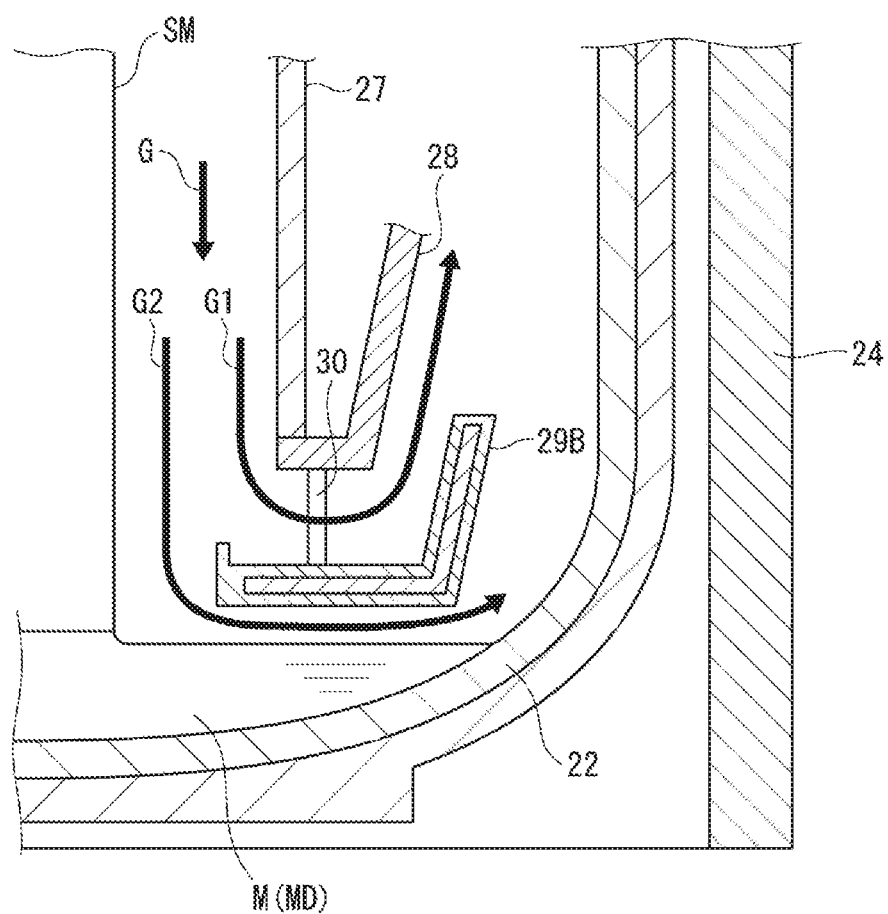
FIG. 3 is an enlarged cross-sectional view showing the flow regulator and the surroundings thereof at a bottom of a crucible when a dopant-added melt is reduced.

Since an outer side of the entire flow regulator 29 is bent upward, even when the amount of the dopant-added melt MD is reduced due to progress in the growth of the monocrystalline silicon SM as shown in FIG. 3, the monocrystalline silicon SM can be kept being pulled up while the extension 29B provided on the outer side of the flow regulator 29 is kept in no contact with an inner surface of the crucible 22 whose diameter at a bottom portion is reduced toward the bottom (e.g., a round bottom).

Further, since the upper end of the extension 29B is positioned above the bottom surface 28A of the heat shield 28, the extension 29B can prevent radiant heat from at least one of the dopant-added melt MD, the crucible 22 and the heater 24 from reaching the monocrystalline silicon SM through the first flow path R1, so that a temperature gradient in a pull-up direction of the monocrystalline silicon SM can be increased. Furthermore, since the heat insulation material 29D inside the flow regulator 29 can more effectively block the radiant heat, the temperature gradient in the pull-up direction of the monocrystalline silicon SM can be further increased.

Modification(s)

The invention is not limited to the above exemplary embodiment but any improvement and design change are possible without departing from the scope of the present disclosure. Moreover, the specific procedure and configuration for implementing the invention may be any procedures and configurations without departing from the scope of the present disclosure.

For instance, in some embodiments, the flow regulation cylinder 27 is not provided. As long as the internal pressure of the chamber 21 is controlled to 20 kPa or more, the monocrystalline silicon SM can be manufactured in the same manner as in the above exemplary embodiment with the reduced evaporation of the dopant.

Moreover, for instance, in some embodiments, the inner diameter D2 of the body 29A is equal to or more than the inner diameter D1 at the lower end of the heat shield 28. For instance, in some embodiments, the height H1 of the first flow path R1 is equal to or less than the height H2 of the second flow path R2.

Figure 4:
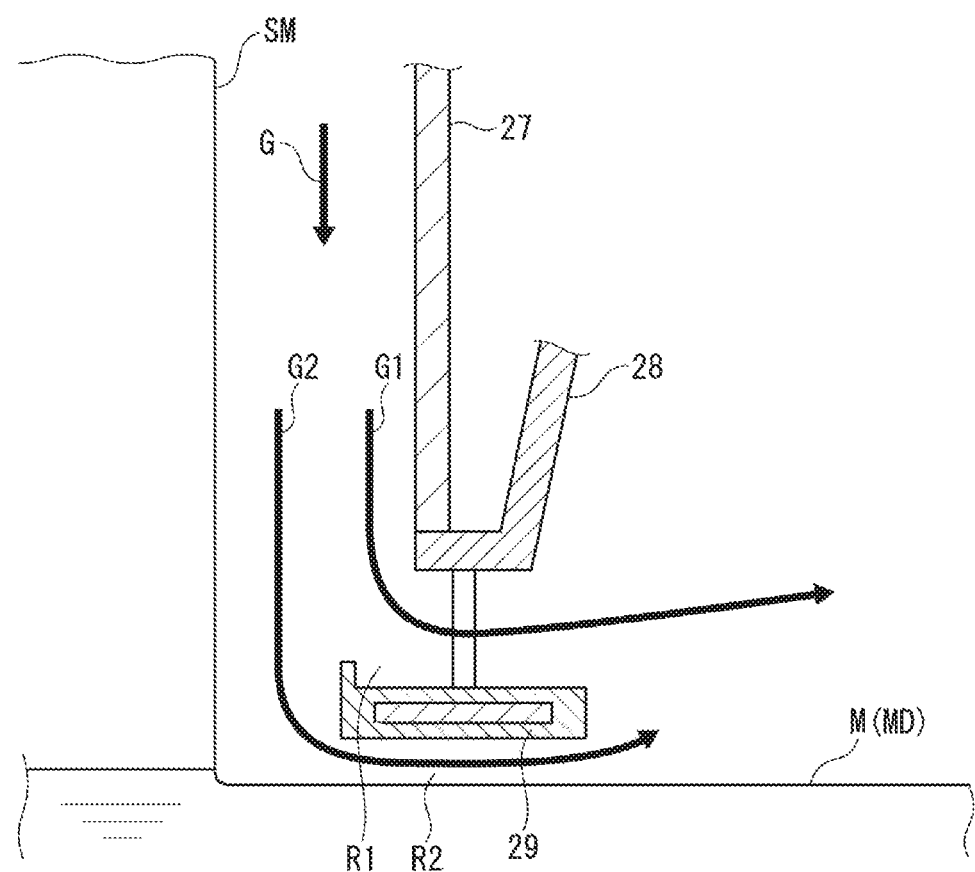
FIG. 4 illustrates a flow of an inert gas near a surface of the dopant-added melt when the flow regulator includes no extension.

Further, for instance, in some embodiments, the extension 29B is not provided to the flow regulator 29 as shown in FIG. 4. When the extension 29B is provided, for instance, in some embodiments, the body 29A and the extension 29B are respectively not in parallel to the bottom surface 28A of the heat shield 28 and the outer circumferential surface 28B of the heat shield 28. In some embodiments, the upper end of the extension 29B is positioned at the same height as that of the lower end of the heat shield 28, or is positioned at a lower height than the lower end of the heat shield 28. For instance, in some embodiments, the heat insulation material 29D is not provided inside the flow regulator 29.

EXAMPLE(S)

Next, the invention will be described more in detail by Examples, however, is by no means limited to the Examples.
Experiment 1: Research of Relationship between Presence or Absence of Flow regulator and Internal Pressure of Chamber, and Dopant Evaporation Amount

EXPERIMENT EXAMPLE 1

A monocrystal pull-up apparatus was prepared without the flow regulator 29, which was the only difference from the monocrystal pull-up apparatus 1 shown in FIG. 1. The inner diameter D1 at the lower end of the heat shield 28 was set at 280 mm.

The internal pressure of the chamber 21 was set at 80 kPa. Monocrystalline silicon SM having the following properties was manufactured under the following manufacturing conditions. An evaporation amount of the dopant at this time was measured.

A concentration of the dopant incorporated into the monocrystalline silicon SM was calculated on a basis of an electrical resistivity of the monocrystalline silicon SM at this time. The evaporation amount of the dopant from the dopant-added melt MD was measured on a basis of this concentration of the dopant incorporated. The thus calculated evaporation amount increased as the electrical resistivity of the monocrystalline silicon SM became higher with respect to a desired value.

<Manufacturing Conditions>
Flow rate of inert gas: 150 L/min
Distance (constant during the manufacturing) between the lower end of the heat shield 28 and the surface of the dopant-added melt MD: 10 mm
<Properties of Monocrystalline Silicon>
Dopant: red phosphorus
Electrical resistivity: from 0.6 mΩ·cm to 1.2 mΩ·cm
Diameter of the straight body: 200 mm.

EXPERIMENT EXAMPLE 2

A monocrystal pull-up apparatus 1 was prepared by providing the flow regulator 29 as shown in FIG. 1 to the monocrystal pull-up apparatus used in Experiment Example 1. Components of the monocrystal pull-up apparatus 1 were configured as follows.
<Structures of Components of Monocrystal Pull-Up Apparatus>
Inner diameter D2 of the body 29A of the flow regulator 29: 250 mm
Height H1 of the first flow path R1: 10 mm
Width of the gas receiver 29E: 15 mm
The internal pressure of the chamber 21 was set at 10 kPa. Monocrystalline silicon having the same properties as in Experiment Example 1 was manufactured under the following manufacturing conditions. The evaporation amount of the dopant at this time was measured.
<Manufacturing Conditions>
Flow rate of inert gas: 150 L/min
Height H2 (constant during the manufacturing) of the second flow path R2: 12.5 mm

EXPERIMENT EXAMPLES 3 TO 5

Figure 5:
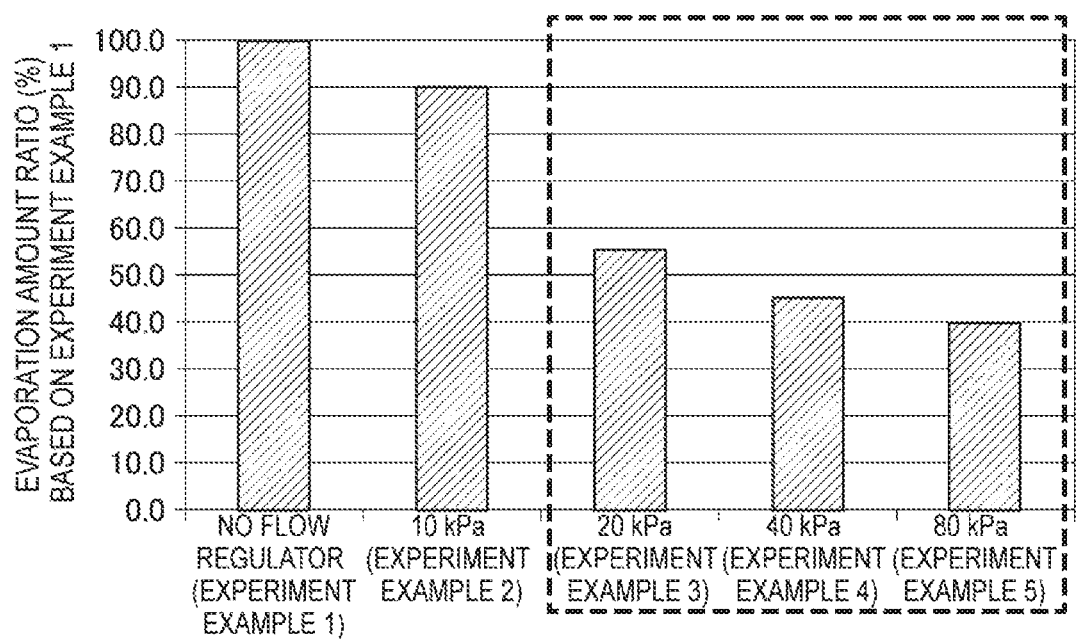
FIG. 5 is a graph showing a relationship among presence or absence of the flow regulator, an internal pressure of a chamber, and an evaporation amount of a dopant (hereinafter, also referred to as a dopant evaporation amount) in Experiment 1 in Examples of the invention.

Monocrystalline silicon in each of Experiment Examples 3 to 5, having the same properties as in Experiment Example 1, was manufactured with the same arrangement and conditions as in Experiment Example 2, except that the internal pressure of the chamber 21 was changed to 20 kPa (Experiment Example 3), 40 kPa (Experiment Example 4) and 80 kPa (Experiment Example 5). The evaporation amount of the dopant at this time was measured.
Evaluation FIG. 5 shows dopant evaporation amount ratios in Experiment Examples 2 to 5 provided that the dopant evaporation amount in Experiment Example 1 is defined as 100%.

It has been found from comparison between Experiment Example 1 and Experiment Example 2 that the dopant evaporation amount was reduced by providing the flow regulator 29 but the decreased amount was not sufficient.

In comparison among Experiment Examples 2 to 5, it has been found that the dopant evaporation amount in Experiment Example 3 was reduced at the larger amount than that in Experiment Example 2, and that the larger dopant evaporation amount was reduced as the internal pressure of the chamber 21 was increased from the results of Experiment Examples 4 and 5.

Figure 6:
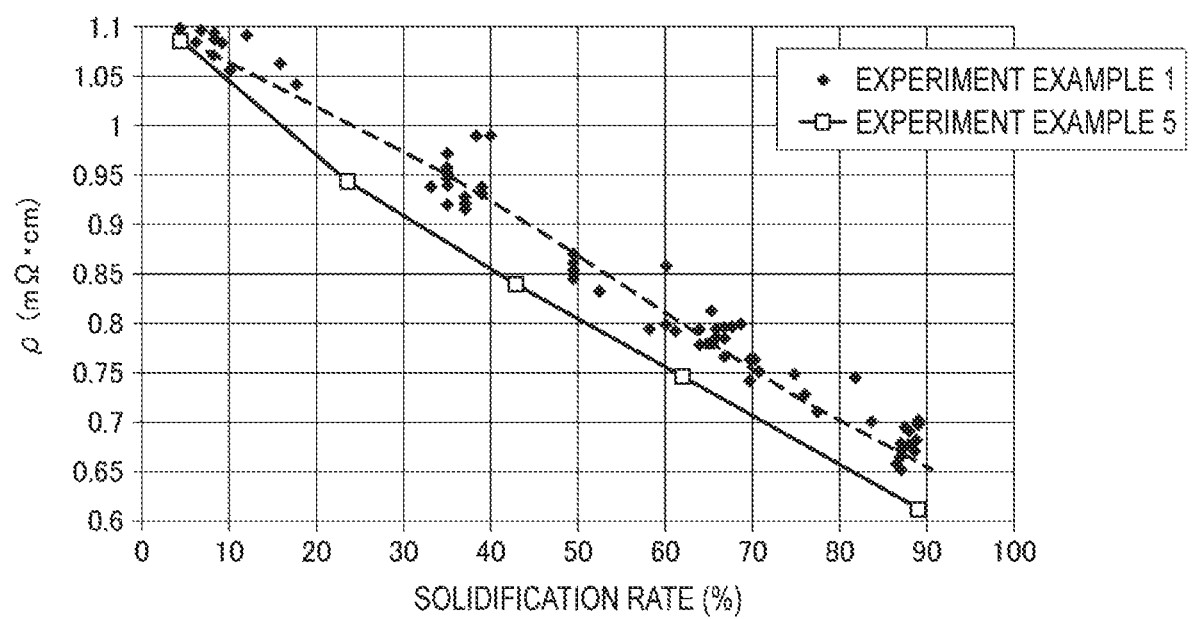
FIG. 6 is a graph showing a relationship between presence or absence of the flow regulator and electrical resistivity in Experiment 2 in Examples of the invention.

In view of the above, it has been found that evaporation of the dopant is reducible by providing the flow regulator 29 in the monocrystal pull-up apparatus 1 and by controlling the internal pressure of the chamber 21 to 20 kPa or more (and 80 kPa or less) during the growth of the monocrystalline silicon.
Experiment 2: Research of Relationship between Presence or Absence of Flow Regulator and Electrical Resistivity Pieces of monocrystalline silicon were prepared under the same conditions as in Experiment Examples 1 and 5. An electrical resistivity of a straight body of each of the pieces of monocrystalline silicon was measured at each of solidification rates. The measurement results are shown in FIG. 6. It should be noted that the solidification rate of the straight body is 0% at an upper end and 100% at a lower end.

It was observed that the overall electrical resistivity in Experiment Example 5 was lower than that in Experiment Example 1. This is considered to be because the evaporation of the dopant was more reduced in Experiment Example 5 than in Experiment Example 1 as described in Experiment 1.
Experiment 3: Research of Relationship Among Shape of Flow Regulator, Dopant Evaporation Amount, and Temperature Gradient Ratio in Pull-Up Direction of Monocrystalline Silicon

EXPERIMENT EXAMPLE 6

The same monocrystal pull-up apparatus as in Experiment Example 5 was prepared except that the flow regulator 29 shown in FIG. 1 was replaced by a flow regulator consisting of the body 29A shown in FIG. 4. Monocrystalline silicon having the same properties as in Experiment Example 5 was manufactured with the same arrangement and conditions as in Experiment Example 5. The evaporation amount of the dopant at this time was measured. Moreover, the temperature gradient in the pull-up direction in the monocrystalline silicon was examined.
Evaluation Monocrystalline silicon was manufactured under the same conditions as in Experiment Example 5. The evaporation amount of the dopant and the temperature gradient in the pull-up direction in the monocrystalline silicon were examined.

Figure 7:
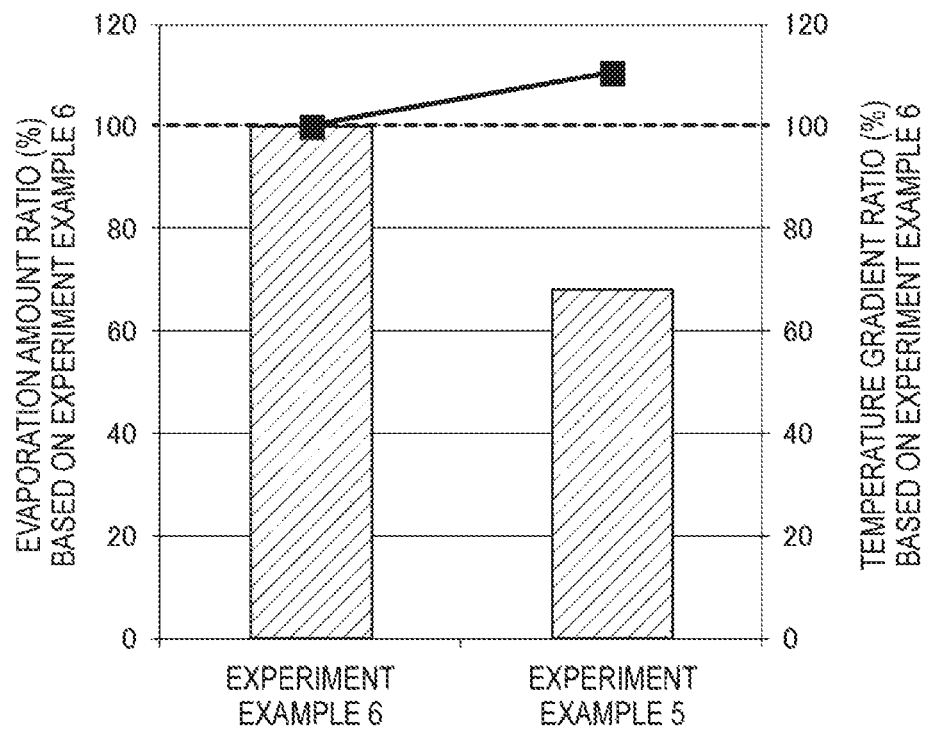
FIG. 7 is a graph showing a relationship among a shape of the flow regulator, a dopant evaporation amount, and a temperature gradient ratio in a pull-up direction of monocrystalline silicon in Experiment 3 in Examples of the invention.

FIG. 7 shows the dopant evaporation amount ratio (shown by a bar graph) in Experiment Example 5 provided that the dopant evaporation amount in Experiment Example 6 is defined as 100%, and a temperature gradient ratio (shown by a line graph) in Experiment Example 5 provided that the temperature gradient in Experiment Example 6 is defined as 100%. In order to obtain the temperature gradient ratio, a relationship between a temperature and a distance from an interfacial surface between the dopant-added melt MD and the monocrystalline silicon SM at an axial core of the monocrystalline silicon SM is obtained using heat conduction analysis software (simulation). An inclination of the graph showing the relationship is defined as a temperature gradient.

The dopant evaporation amount in Experiment Example 5 was decreased to about 70% of the dopant evaporation amount in Experiment Example 6. It has been found from the above that the extension 29B provided to the flow regulator 29 can guide the first flow gas G1 diagonally upward and outward to reduce the evaporation of the dopant.

The temperature gradient in Experiment Example 5 was increased to about 110% of the temperature gradient in Experiment Example 6. It has been found from the above that the extension 29B provided to the flow regulator 29 can prevent radiant heat from at least one of the dopant-added melt MD, the crucible 22 or the heater 24 from reaching the monocrystalline silicon through the first flow path R1.

The invention claimed is:

1. A manufacturing method of monocrystalline silicon using a monocrystal pull-up apparatus, the monocrystal pull-up apparatus comprising:
    a crucible;
    a crucible driver configured to raise, lower and rotate the crucible;
    a heater configured to heat the crucible to generate a dopant-added melt in which a dopant is added to a silicon melt;
    a pull-up portion configured to bring a seed crystal into contact with the dopant-added melt and subsequently pull up the seed crystal to grow monocrystalline silicon;
    a cylindrical heat shield provided above the crucible, surrounding the monocrystalline silicon;
    a chamber housing the crucible, the heater and the heat shield; and
    an intake provided on an upper side of the chamber and configured to introduce inert gas into the chamber, and
    a flow regulator disposed above the silicon melt and under the heat shield, the flow regulator comprising an annular plate body surrounding the monocrystalline silicon, wherein:
    the body has an inner diameter smaller than an inner diameter at a lower end of the heat shield and partially overlaps with the heat shield in a view from above, and
    the body comprises a gas receiver that projects toward the monocrystalline silicon with respect to the heat shield and has an upper surface facing upward,
    the manufacturing method comprising:
        during the growth of the monocrystalline silicon, simultaneously,
            controlling an internal pressure of the chamber to 20 kPa or more;
            keeping the flow regulator spaced from the dopant-added melt; and
            introducing the inert gas from above to between the monocrystalline silicon and the heat shield to divide the inert gas into:
                a first flow gas introduced along the upper surface of the gas receiver into a first flow path between the heat shield and the flow regulator to flow along the first flow path to be away from the monocrystalline silicon; and
                a second flow gas flowing close to the monocrystalline silicon with respect to the gas receiver to be introduced into a second flow path between the flow regulator and a surface of the dopant-added melt to flow along the second flow path to be away from the monocrystalline silicon.

2. The manufacturing method of the monocrystalline silicon according to claim 1, wherein the monocrystalline silicon grows while a height of the first flow path is kept higher than a height of the second flow path.

3. The manufacturing method of the monocrystalline silicon according to claim 1, wherein the flow regulator comprising an extension extending a diagonally-upward-and-outward direction from an outer edge of the body is provided to introduce the first flow gas in the diagonally-upward-and-outward direction.

4. The manufacturing method of the monocrystalline silicon according to claim 3, wherein the flow regulator is disposed with an upper end of the extension being positioned above the lower end of the heat shield to prevent, with the extension, radiant heat from at least one of the dopant-added melt, the crucible or the heater from reaching the monocrystalline silicon through the first flow path.

5. The manufacturing method of the monocrystalline silicon according to claim 1, wherein the flow regulator comprising a heat insulation material therein is disposed to prevent, with the heat insulation material, radiant heat from at least one of the dopant-added melt, the crucible or the heater from reaching the monocrystalline silicon.

6. A flow regulator configured to attach to a monocrystal pull-up apparatus, the monocrystal pull-up apparatus comprising:
   a crucible;
   a crucible driver configured to raise, lower and rotate the crucible;
   a heater configured to heat the crucible to generate a dopant-added melt in which a dopant is added to a silicon melt;
   a pull-up portion configured to bring a seed crystal into contact with the dopant-added melt and subsequently pull up the seed crystal to grow monocrystalline silicon;
   a cylindrical heat shield provided above the crucible, configured to surround the monocrystalline silicon as it is being grown within the apparatus;
   a chamber housing the crucible, the heater and the heat shield; and
   an intake provided on an upper side of the chamber and configured to introduce inert gas into the chamber,
   the flow regulator comprising:
   a body in a form of an annular plate, configured to be provided under the heat shield and to surround the monocrystalline silicon as it is being grown within the apparatus, the body configured to form a first flow path between the body and the heat shield and to form a second flow path between the body and a surface of the dopant-added melt used to grow monocrystalline silicon; and
   an extension extending diagonally upward and outward from an outer edge of the body, wherein:
   the body has an inner diameter smaller than an inner diameter at a lower end of the heat shield and is configured to partially overlap with the heat shield in a view from above, and
   the body comprises a gas receiver that is configured to:
   be located inside with respect to the heat shield,
   have an upper surface facing upward, and
   project toward the monocrystalline silicon as it is being grown within the apparatus with respect to the heat shield.

7. The flow regulator according to claim 6, wherein at least one of the body or the extension comprises a heat insulation material therein.

8. A monocrystal pull-up apparatus comprising:
   a crucible;
   a crucible driver configured to raise, lower and rotate the crucible;
   a heater configured to heat the crucible to generate a dopant-added melt in which a dopant is added to a silicon melt;
   a pull-up portion configured to bring a seed crystal into contact with the dopant-added melt and subsequently pull up the seed crystal to grow monocrystalline silicon;
   a cylindrical heat shield provided above the crucible, configured to surround the monocrystalline silicon as it is being grown within the apparatus;
   a chamber housing the crucible, the heater and the heat shield;
   an intake provided on an upper side of the chamber and configured to introduce inert gas into the chamber; and
   the flow regulator according to claim 7 provided under the heat shield.

\* \* \* \* \*